United States Patent

Glasser et al.

[15] 3,660,765

[45] May 2, 1972

[54] SQUELCH CIRCUIT HAVING SHORT AND LONG TIME CONSTANT FILTERS FOR SQUELCH TAIL ELIMINATION

[72] Inventors: James R. Glasser, Naperville; Stanley J. Tomsa, Berwyn, both of Ill.

[73] Assignee: Motorola, Inc., Franklin Park, Ill.

[22] Filed: Apr. 13, 1970

[21] Appl. No.: 28,169

Related U.S. Application Data

[63] Continuation of Ser. No. 643,874, June 6, 1967, abandoned.

[52] U.S. Cl...............................325/478, 325/348, 325/403

[51] Int. Cl...............................H04b 1/10

[58] Field of Search..................325/319, 348, 402, 403, 404, 325/408, 410, 473, 478, 480, 477; 330/141

[56] References Cited

UNITED STATES PATENTS 3,596,184 7/1971 Hanus..................................325/478

*Primary Examiner*—Robert L. Griffin
*Assistant Examiner*—Kenneth W. Weinstein
*Attorney*—Mueller and Aichele

[57] ABSTRACT

A squelch filter circuit is provided having a short time constant ripple filter and a long time constant ripple filter. The long time constant ripple filter is responsive to signals just above squelch threshold in order to provide maximum sensitivity and smooth operation. At strong signal levels, where the long time constant ripple filter is not necessary, the circuit switches to a short time constant filter. The circuit reverts to the long time constant filter if the signal drops to low signal levels relatively slowly, to keep the squelch open during fade and flutter. If the signal drops very rapidly, as, for example, where the transmitter ceases transmission, only the short time constant filter is operative and the turn off of the squelch circuit is very rapid, thus eliminating the noise burst or "squelch tail."

12 Claims, 2 Drawing Figures

INVENTOR
JAMES R. GLASSER
STANLEY J. TOMSA.
BY Mueller, Aichele & Rauner
ATTYS.

SQUELCH CIRCUIT HAVING SHORT AND LONG TIME CONSTANT FILTERS FOR SQUELCH TAIL ELIMINATION

This application is a continuation of application Ser. No. 643,874, filed June 6, 1967, now abandoned.

BACKGROUND OF THE INVENTION

Squelch circuits, responsive to the detected receiver noise, are used in communications receivers to eliminate noise output from the audio section during periods when no signal is received. In order to obtain good threshold sensitivity and to avoid chattering during turn-on of the squelch circuit, sufficient filtering of the detected noise must be provided to reduce its ripple to an acceptable level. A filter having a relatively long time constant increases the response time of the squelch circuit so that a "squelch tail" or noise burst is heard at the end of a transmission. A filter having a relatively short time constant will not provide good threshold sensitivity.

SUMMARY

It is, therefore, an object of this invention to provide an improved squelch filter circuit for a receiver to eliminate long "squelch tails" while maintaining good flutter performance.

Another object of this invention is to provide a squelch filtering circuit for a receiver in which the squelch filter circuit can distinguish between fades or flutter and the end of a received transmission.

In practicing this invention a squelch filter circuit is provided for coupling a detected noise voltage to an audio switch for actuating the audio switch. The squelch filter includes two filters one having a short time constant and the other having a long time constant. The long time constant filter develops a higher output voltage than the short time constant filter and is used for signals just above squelch threshold, to provide good sensitivity and smooth operation of the squelch circuit. A signal level detector is provided which samples either the detected noise signal or the output of the short time constant ripple filter to develop a control signal when the magnitude of the sampled signal is greater than a predetermined level. The control signal is operative to interrupt the long time constant ripple filter so that the short time constant ripple filter is the only filter operative in the circuit. With only the short time constant ripple filter in the circuit, the squelch turns off rapidly when a signal is no longer received, and the "squelch tail" is reduced or eliminated. A fast charging circuit forming part of the long time constant filter acts to keep the squelch open when the signal drops relatively slowly as in fades and flutter.

The invention is illustrated in the drawings of which

DESCRIPTION

Figure 1:
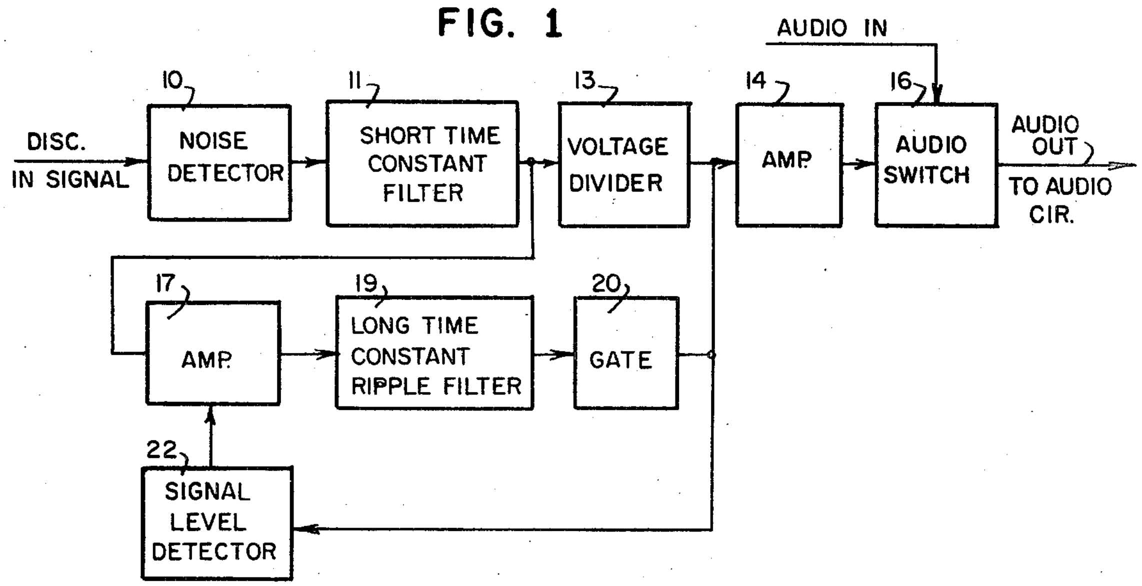
FIG. 1 is a block diagram of a squelch filter circuit.

In FIG. 1 there is shown a block diagram of the squelch filter circuit of this invention. Signals from the output of the discriminator are supplied to noise detector 10 where they are detected to develop a DC signal called a detected noise voltage. The detected noise voltage increases with received signal strength and is coupled to short time constant filter which reduces the ripple. The resulting filtered noise voltage is coupled through voltage divider 13 to amplifier 14 and audio switch 16.

The time constant of filter 11 is relatively short so that when the received signal stops, the filtered noise voltage from filter 11 drops rapidly to turn off the squelch circuit rapidly so that the "squelch tail" is reduced or eliminated. With a short filter time constant, however, threshold sensitivity is reduced and chattering can be present at the turn-on of the squelch circuit, particularly for signals which are just above the squelch threshold.

In order to provide proper filtering for low signal levels, a filter circuit is provided including long time constant filter 19 and amplifier 17. The filtered noise voltage output of filter 19 is coupled to amplifier 14 through gate 20. Voltage divider 13 acts to reduce the filtered noise voltage output from filter 11 so that it is normally less than the filtered noise voltage from filter 19. Gate 20 acts to prevent the application of the filtered noise voltage from filter 11, to filter 19, when a short time constant is desired.

The output signal from amplifier 14 is applied to audio switch 16 which also receives an audio signal from preceding portions of the receiver. Audio switch 16 is connected to subsequent audio stages and applies the audio signal thereto for audible reproduction of the signal. With an output signal from amplifier 14 below (amplifier 14 has 180° phase shift and reverses the polarity of the input signal) a predetermined magnitude, audio switch 16 is actuated to couple the audio signal to the subsequent audio stages. With no received signal present, the output of amplifier 14 is not sufficient to actuate audio switch 16 and the audio signal is not coupled to the subsequent audio stages. Thus with no received signal present there is no output from the audio stages and noise signals are not reproduced.

Signal level detector 22 is coupled to the input of amplifier 14 to develop a control signal with the input signal above a predetermined amplitude. While the signal level detector is shown coupled to the input of amplifier 14 it could also be coupled to the output of noise detector 10 since the signals appearing at the input of amplifier 14 and the output of noise detector 10 are both a measure of the magnitude of the received signal. The control signal output of signal detector 22 is applied to amplifier 17 to interrupt the amplifier. This cuts off the signal to filter 19 to reduce the filtered noise voltage output signal therefrom.

With the filtered noise voltage signal output from filter 19 reduced the gate isolates filter 19 from the rest of the circuit, and only the filtered noise voltage output from filter 11 is operative to control the signal applied to amplifier 14. Gate 20 prevents the filtered noise voltage signal from filter 11 from being coupled to filter 19 so that this signal cannot be stored in filter 19.

A rapid drop in the received signal, such as would occur if the transmitted signal stops, will result in a rapid turn-off of the squelch circuit since the short time constant ripple filter 11 controls this circuit and filter 19 would not be able to develop a filtered noise voltage signal in this short time interval. With relatively slow reductions in the signal strength of the received signal, which could be caused by flutter and fade, the control signal from signal level detector 22 would cease and the fast charging circuit connected to filter 19 would have sufficient time to develop a filtered noise voltage signal in filter 19. With filter 19 actuated the noise voltage signal applied to amplifier 14 would be filtered by filter 19 and thus the squelch circuit would not turn off or chatter during the fade.

Figure 2:
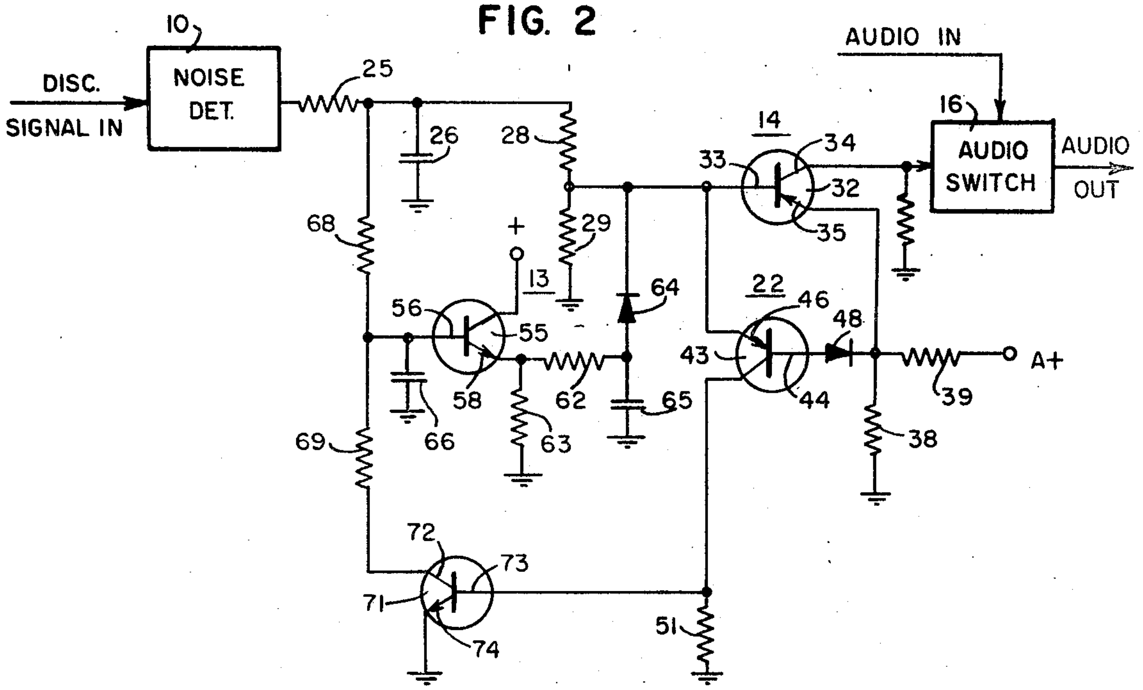
FIG. 2 is a partial schematic and partial block diagram of the squelch filter circuit of FIG. 1.

Referring to FIG. 2 there is shown a partial block diagram and partial schematic of the squelch filter circuit of FIG. 1. The detected noise signal from noise detector 10 increases as the strength of the received signal increases and is applied to a short time constant ripple filter which consists of resistor 25 and capacitor 26. Resistor 25 includes the output impedance of noise detector 10. The output of the ripple filter 25, 26 is applied to a voltage divider 28, 29 and the output of the voltage divider is coupled to base 33 of transistor 32.

With no filtered noise voltage present at the output of filter 25, 26 transistor 32 normally conducts. As the filtered noise voltage applied to base 33 of transistor 32 increases, the conduction of transistor 32 is reduced thereby decreasing the potential applied to audio switch 16 from collector 34. A bias potential for emitter 35 of transistor 32 is furnished by voltage divider resistors 38 and 39 connected to a positive supply potential.

The detected noise voltage is also applied to base 56 of transistor 55 and is filtered by resistor 68 and capacitor 66 to remove high frequency signals which may be present. Filter 66, 68 has a sufficiently short time constant so that it does not affect the operation of the long time constant filter. Transistor 55 and resistor 63 are connected between a positive supply potential and ground to form an emitter follower circuit so that the voltage on emitter 58 is substantially the same as the voltage applied to base 56, minus the base-to-emitter voltage drop. The voltage on emitter 58 is coupled to a long time constant filter consisting of resistors 62 and 63 and capacitor 65. The output of filters 62, 63, 65 is coupled to base 33 of transistor 32 through diode 64.

The charging path for capacitor 65 is through resistor 62 and transistor 55. With transistor 55 cut off, the potential across capacitor 65 discharges through resistors 62 and 63. The impedance of resistors 62 and 63 is sufficiently large so that the time constant of the discharge path for the filter is high. Thus momentary fluctuations, such as fades or flutters, do not affect the voltage coupled to base 33 of transistor 32 appreciably since the voltage across the capacitor 65 does not change substantially during these fluctuations. The filtered noise voltage at the output of voltage divider 28, 29 is lower than the filtered noise voltage from the long time constant filter 62, 63, 65 and thus, when the long time constant filter is not interrupted, it controls the action of the squelch circuit.

When the signal is sufficiently strong so that the long time constant filter is not required, it is desirable to use only the short time constant filter to minimize or eliminate the squelch tail which would be present when the received signal stops. With the long time constant filter in the squelch filter circuit the potential across capacitor 65 would discharge through resistors 62 and 63. The voltage across capacitor 65 would keep the squelch open a period of time sufficiently long to permit noise signals to be heard in the audio output. To prevent this a bias circuit consisting of transistor 71 and resistor 69 and a signal level detection circuit consisting of transistor 43 and resistor 51 are provided. Base 44 of transistor 43 is normally more positive than emitter 46 so that transistor 43 is biased off. With transistor 43 biased off, base 73 of transistor 71 is at ground potential through resistor 51 so that transistor 71 is biased off. As the noise voltage on base 33 of transistor 32 increases beyond a predetermined level, transistor 43 is biased on causing current to flow through resistor 51. The current flow through resistor 51 biases base 73 positive with respect to emitter 74 so that transistor 71 is biased on. With transistor 71 biased on, the flow of current through resistors 68 and 69 and collector 72, emitter 74 of transistor 71 interrupts the detected noise voltage signal applied to base 56 of transistor 55. The potential across capacitor 65 then discharges through resistors 62 and 63 so that the long time constant filter 62, 63, 65 is no longer effective to control the response time of the squelch circuit.

If the received signal stops suddenly, short time constant filter 25, 26 reacts rapidly enough so that the audio switch 16 is turned off before a "noise tail" appears at the audio output. If the signal fades relatively slowly, transistor 55 will become conductive to charge capacitor 65 rapidly so that the long time constant filter will become effective to control the response time of the squelch filter circuit.

We claim:

1. A squelch filter circuit for coupling a detected noise voltage to a switch for actuating the same, said squelch filter circuit including in combination:

first circuit means with filter means having a particular time constant, said first circuit means being adapted to receive the detected noise voltage and being responsive thereto to develop a first filtered noise voltage;

second circuit means having a time constant greater than said particular time constant, said second circuit means being adapted to be interrupted and further adapted to develop a second voltage in response to the detected noise voltage;

a switch responsive to said first and second voltages greater than a predetermined magnitude to be actuated thereby;

circuit means coupling said first and second circuit means to the switch;

signal level detector means for developing a control signal in response to the detected noise voltage being greater than a particular magnitude; and means responsive to said control signal for interrupting the second circuit means to remove said second voltage from the switch.

2. A squelch filter circuit for coupling a detected noise voltage to a switch for actuating the same, said squelch filter circuit including in combination, first filter means having a particular time constant, said first filter means being adapted to receive the detected noise voltage and being responsive thereto to develop a first filtered noise voltage, second filter means having a time constant greater than said particular time constant, said second filter means being adapted to be interrupted and further adapted to receive the detected noise voltage and to develop a second filtered noise voltage therefrom, the switch being responsive to the larger of said first and second filtered noise voltages greater than a predetermined magnitude to be actuated thereby, circuit means coupling said first and second filter means to the switch, signal level detector means to develop a control signal in response to the detected noise voltage being greater than a particular magnitude, and means responsive to said control signal for interrupting the second filter means to remove said second filtered noise voltage from the switch.

3. The squelch filter circuit of claim 2 wherein, said second filter means includes charge storing means and first and second charging path means connected to said charge storing means, said first charging path being adapted to receive said detected noise voltage and couple the same to said charge storage means, said second charging path means having at least a portion thereof different from said first charging path means and further having a higher impedance than said first charging path means whereby the time constant of said charge storing means and said second charging path means is greater than said particular time constant.

4. The squelch filter circuit of claim 3 wherein, said first charging path means includes amplifier means having an input circuit adapted to receive the detected noise signal, said amplifier means further having a low impedance output circuit coupled to said charge storing means to provide a charging path for the rapid supply of charges to said charge storing means.

5. The squelch filter circuit of claim 3 wherein, said circuit means includes gate means coupling said second filter means to the switch, said gate means acting to prevent the coupling of said first filtered noise voltage to the second filter means when said first filtered noise voltage exceeds the second filtered noise voltage.

6. The squelch filter circuit of claim 5 wherein, said circuit means further includes a voltage divider circuit coupled to said first filter means for reducing the amplitude of said first filtered noise voltage.

7. A squelch filter circuit for coupling a detected noise voltage to an audio switch for actuating the same, said squelch filter circuit including in combination, first filter means having a particular time constant and being adapted to receive the detected noise voltage, said first filter means further being responsive to the detected noise voltage to develop a first filtered noise voltage and being coupled to the audio switch for applying said first filtered noise voltage thereto, second filter means including charge storage means and a first charging path having a time constant greater than said particular time constant, said second filter means further including a second charging path cooperating with said charge storage means and having a time constant less than the time constant provided by said first charging path and said charge storage means, said second charging path being adapted to be interrupted in response to a control signal applied thereto and further being adapted to receive the detected noise voltage, said second filter means being responsive to the detected noise voltage to develop a second filtered noise voltage, gate means coupling said second filter means to the audio switch and said first filter means, said gate means being responsive to the magnitude of said first and second filtered noise voltages to apply said second filtered noise voltage to the audio switch with said first filtered noise voltage less than the second filtered noise voltage and further to block said first filtered noise voltage from said second filter means with said first filtered noise voltage greater than said second filtered noise voltage, signal level detector means coupled to said first filter means for receiving said first filtered noise voltage and further being coupled to said second charging path, said signal level detector means being responsive to said first filtered noise voltage greater than a predetermined level to develop said control signal whereby said second filtered noise voltage is interrupted.

8. The squelch filter circuit of claim 7 wherein, said second charging path includes an emitter follower circuit having an input circuit and an output circuit, said output circuit being coupled to said charge storage means, said signal level detector means including bias circuit means coupled to said input circuit means, said bias circuit means being responsive to said control signal to bias off said emitter follower circuit.

9. The squelch filter circuit of claim 8 wherein, said gate means includes a diode poled to conduct with said second filtered noise voltage greater than said first filtered noise voltage.

10. The squelch filter circuit of claim 9 wherein, said charge storage means is a capacitor.

11. A squelch circuit for a receiver which has an output circuit for translating detected signals, such squelch circuit selectively enabling and disabling the output circuit in response to a detected noise voltage which varies with the level of a received signal, and acting to disable the output circuit following termination of the received signal with a time delay which depends upon the received signal level, said squelch circuit including in combination:

first circuit means including filter means having a particular time constant, said first circuit means being adapted to receive the detected noise voltage and being responsive thereto to develop a first filtered noise voltage, said particular time constant defining the minimum delay in disabling the audio circuit;

second circuit means coupled to said first circuit means and including filter means having a time constant greater than said particular time constant, said second circuit means being responsive to said first filtered noise voltage to develop a second voltage and being adapted to receive a control signal;

switch means coupled to the output circuit of the receiver for controlling the same and responsive to said second voltage to be actuated thereby;

signal level detector means for developing a control signal which changes in response to the detected noise voltage; and means for applying said control signal to said second circuit means for modifying the action of second circuit means in accordance with the level of the detected noise voltage.

12. A squelch circuit in accordance with claim 11 wherein said signal level detector means includes resistor means and a transistor connected in series therewith, with said transistor being selectively rendered conductive in accordance with the level of the detected noise voltage to complete the circuit through said resistor means.

* * * * *